(12) United States Patent
Iizuka

(10) Patent No.: US 12,270,099 B2
(45) Date of Patent: Apr. 8, 2025

(54) FILM-FORMING DEVICE, FILM-FORMING UNIT, AND FILM-FORMING METHOD

(71) Applicant: Takashi Iizuka, Nara (JP)

(72) Inventor: Takashi Iizuka, Nara (JP)

(*) Notice: Subject to any disclaimer, the term of this patent is extended or adjusted under 35 U.S.C. 154(b) by 0 days.

(21) Appl. No.: 18/251,400

(22) PCT Filed: Nov. 6, 2020

(86) PCT No.: PCT/JP2020/041602
§ 371 (c)(1),
(2) Date: May 2, 2023

(87) PCT Pub. No.: WO2022/097286
PCT Pub. Date: May 12, 2022

(65) Prior Publication Data
US 2023/0304140 A1 Sep. 28, 2023

(51) Int. Cl.
C23C 14/32 (2006.01)
C23C 14/14 (2006.01)
C23C 14/50 (2006.01)

(52) U.S. Cl.
CPC ............ C23C 14/325 (2013.01); C23C 14/14 (2013.01); C23C 14/505 (2013.01)

(58) Field of Classification Search
CPC .................................................. C23C 14/325
See application file for complete search history.

(56) References Cited

U.S. PATENT DOCUMENTS

| 4,729,905 A * | 3/1988 | Zhed ..................... C23C 14/586 427/295 |
| 7,592,061 B1 | 9/2009 | Yamamoto |
| 2005/0115827 A1 | 6/2005 | Wickramanayaka et al. |
| 2006/0096851 A1 | 5/2006 | Lavitsky et al. |
| 2007/0137566 A1 * | 6/2007 | Cselle ............... H01J 37/32568 118/715 |

(Continued)

FOREIGN PATENT DOCUMENTS

| CN | 105671496 A | 6/2016 |
| EP | 0462303 A1 * | 12/1991 |

(Continued)

OTHER PUBLICATIONS

Extended European Search Report in EP Application No. 20960838.9, dated Nov. 8, 2023, 9pp.

(Continued)

*Primary Examiner* — John J Brayton
(74) *Attorney, Agent, or Firm* — HAUPTMAN HAM, LLP

(57) ABSTRACT

A film-forming device includes: a chamber in which a mold is to be housed for shearing work; a support disposed in the chamber, the support being configured to support the mold with a hole of the mold being open in a vertical direction; and an evaporation source disposed in the chamber, the evaporation source having an evaporation surface from which metal ions are to be generated. The evaporation source is installed such that the evaporation surface is directed in a prescribed direction which is tilted with respect to a horizontal direction, and in the prescribed direction in which the evaporation surface is directed, part of an inner peripheral surface of the hole of the mold is located.

2 Claims, 5 Drawing Sheets

(56) References Cited

U.S. PATENT DOCUMENTS

| | | | |
|---|---|---|---|
| 2007/0240982 A1* | 10/2007 | Tamagaki | H01J 37/3266 |
| | | | 204/298.41 |
| 2008/0116067 A1 | 5/2008 | Lavitsky et al. | |
| 2011/0314991 A1 | 12/2011 | Yamamoto et al. | |
| 2013/0164437 A1* | 6/2013 | Yamazaki | H05B 33/10 |
| | | | 118/500 |
| 2014/0377023 A1 | 12/2014 | Bohlmark et al. | |
| 2015/0247233 A1 | 9/2015 | Fujii | |

FOREIGN PATENT DOCUMENTS

| | | | |
|---|---|---|---|
| JP | S62290867 A | 12/1987 | |
| JP | H794412 A | 4/1995 | |
| JP | 2008519163 A | 6/2008 | |
| JP | 2009182140 A | 8/2009 | |
| JP | 201211393 A | 1/2012 | |
| JP | 2013147743 A | 8/2013 | |
| JP | 2014114507 A | 6/2014 | |
| KR | 10-2010-0073522 A | 7/2010 | |
| WO | 2009096095 A1 | 8/2009 | |

OTHER PUBLICATIONS

International Search Report in PCT/JP2020/041602, mailed Dec. 28, 2020. 4pp.
Notice of Reasons for Refusal in JP Application No. 2021-549716 mailed Aug. 30, 2022. 6pp.
Decision of Grant in JP Application No. 2021-549716 mailed Jan. 31, 2023. 6pp.

* cited by examiner

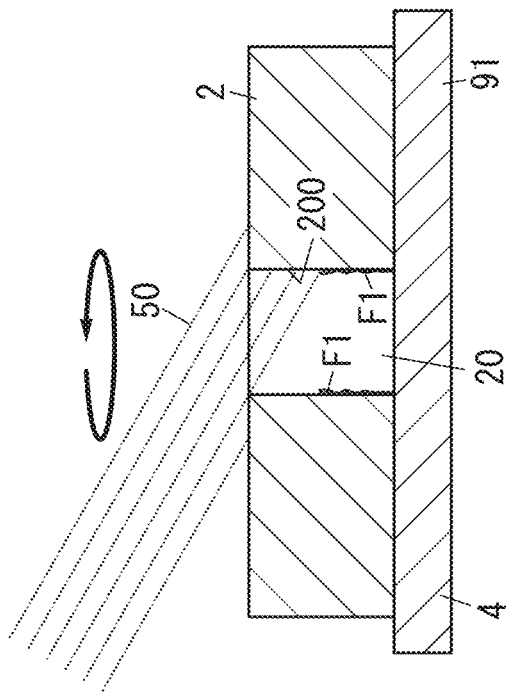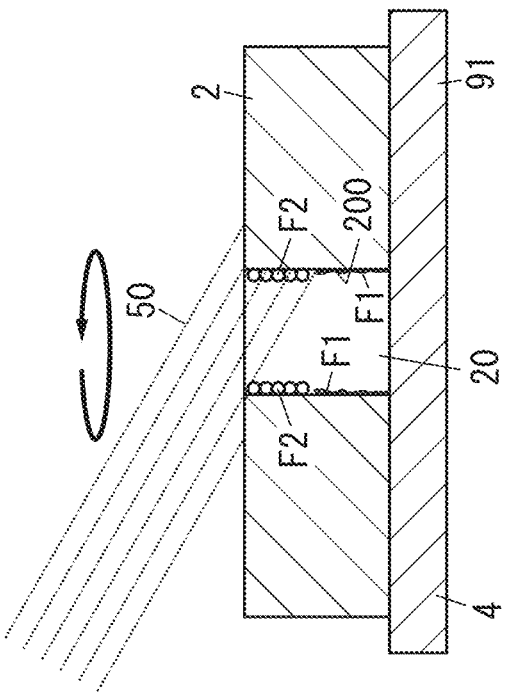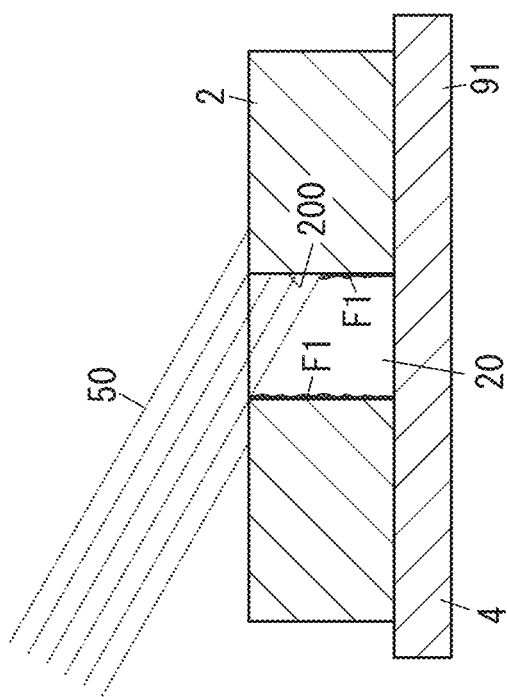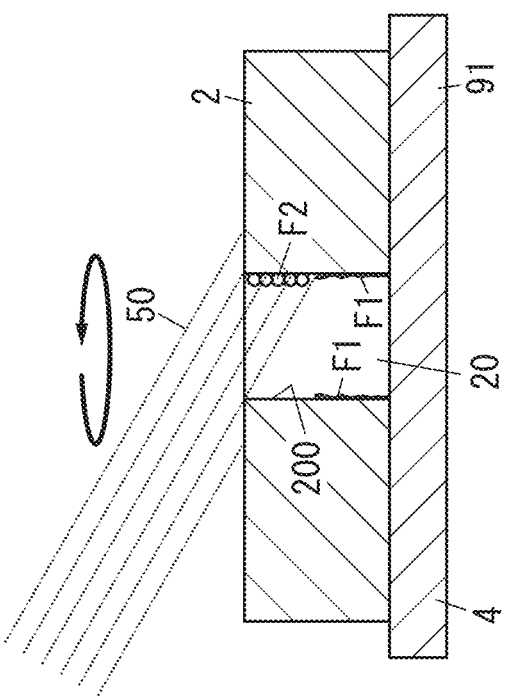

FILM-FORMING DEVICE, FILM-FORMING UNIT, AND FILM-FORMING METHOD

RELATED APPLICATIONS

The present application is a National Phase of International Application Number PCT/JP2020/041602, filed on Nov. 6, 2020.

TECHNICAL FIELD

The present disclosure relates to film-forming devices, film-forming units, and film-forming methods and more specifically relates to a film-forming device configured to form a film on a substrate having a hole, a film-forming unit, and a film-forming method.

BACKGROUND ART

Patent Literature 1 describes a film deposition device that forms a film on a substrate such as a mold for use in press work.

The film deposition device includes a vacuum chamber that accommodates a substrate, an evaporation source that is installed on an inner wall surface of the vacuum chamber, and a worktable that rotates the substrate accommodated in the vacuum chamber around a vertical axis (an axis parallel to the up/down direction). The evaporation source evaporates an evaporation material attached to the evaporation source and irradiates a surface of the substrate with metal ions generated by the evaporation.

Incidentally, in the film deposition device, the evaporation source has a radiation surface which radiates the metal ions and which is directed in the horizontal direction. Thus, in order to form the film on an inner peripheral surface of a hole formed in the substrate, for example, the substrate has to be disposed at a tilt such that part of the inner peripheral surface of the hole faces (in other words, faces straight in front of) the radiation surface. Then, the orientation of the substrate has to be changed several times in order to form a film on the inner peripheral surface over the entire length in the circumferential direction of the hole. However, if the orientation of the substrate is changed several times to form the film on the inner peripheral surface, the thickness of the film formed on the inner peripheral surface is less likely to be uniform in the circumferential direction, and the adhesiveness of the film may be unstable.

Moreover, when the substrate is disposed at a tilt, impurities such as an oxide film peeled off from the inner peripheral surface in an initial stage of bombarding the inner peripheral surface of the hole of the substrate with metal ions tend to deposit on the other part of the inner peripheral surface, which reduces the adhesiveness of the film.

CITATION LIST

Patent Literature

Patent Literature 1: JP 2014-114507 A

SUMMARY OF INVENTION

It is an object of the present disclosure to provide a film-forming device, a film-forming unit, and a film-forming method configured to improve the adhesiveness of a film on an inner peripheral surface of a hole formed in a substrate.

A film-forming device of an aspect according to the present disclosure is a film-forming device configured to form a film on a substrate having a hole. The film-forming device of the aspect includes: a chamber in which the substrate is to be housed; a support disposed in the chamber, the support being configured to support the substrate with the hole being open in a vertical direction; and an evaporation source disposed in the chamber, the evaporation source having an evaporation surface from which metal ions are generated. The evaporation source is installed with the evaporation surface being directed in a prescribed direction which is tilted with respect to a horizontal direction such that part of an inner peripheral surface of the hole of the substrate is located in the prescribed direction.

Moreover, a film-forming unit of an aspect according to the present disclosure includes: a door detachably attached to a chamber body in which a substrate having a hole is to be housed; and an evaporation source installed on the door, the evaporation source having an evaporation surface from which metal ions are to be generated. The evaporation source is installed with the evaporation surface being directed in a prescribed direction which is tilted with respect to a horizontal direction.

A film-forming method of an aspect according to the present disclosure is a film-forming method including forming a film on a substrate having a hole. The film-forming method of the aspect includes a disposition step, a bombardment step, and a film-forming step. The disposition step includes disposing the substrate in a chamber with the hole being open in a vertical direction. The bombardment step includes bombarding an inner peripheral surface of the hole of the substrate with ions to clean the inner peripheral surface. The film-forming step includes forming the film from metal ions on the inner peripheral surface, the metal ions being generated from an evaporation source installed in the chamber. The evaporation source has an evaporation surface from which the metal ions are to be generated. The evaporation source is installed with the evaporation surface being directed in a prescribed direction which is tilted such that part of an inner peripheral surface of the hole of the substrate is located in the prescribed direction.

BRIEF DESCRIPTION OF DRAWINGS

FIGS. 4A to 4D are front views sequentially showing a film-forming method of forming a film on an inner peripheral surface of a hole of a substrate by using the film-forming device.

DESCRIPTION OF EMBODIMENTS

Embodiment

1. Overview

Figure 1:
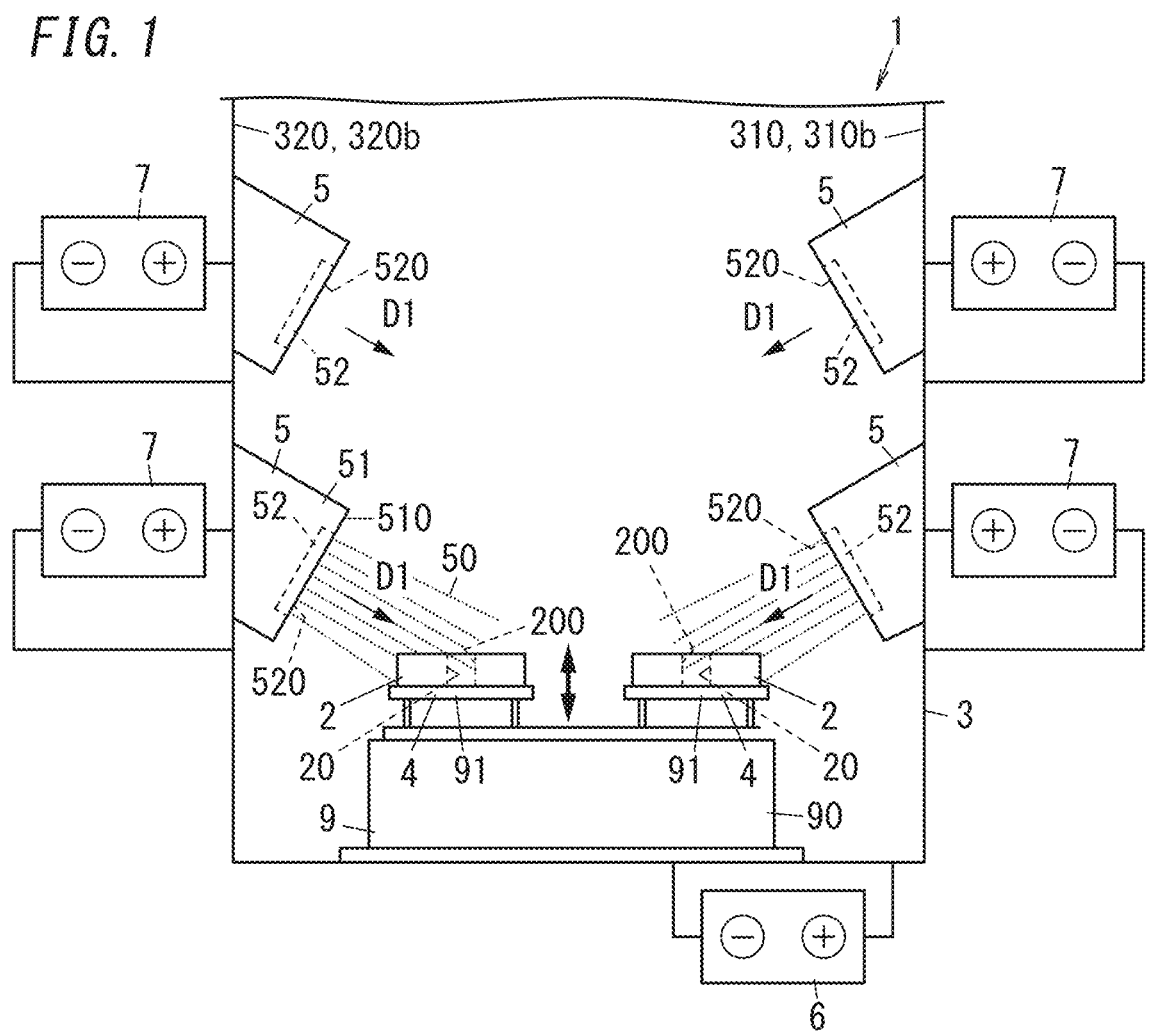
FIG. 1 is a front view schematically showing a film-forming device of an embodiment according to the present disclosure.
Figure 2:
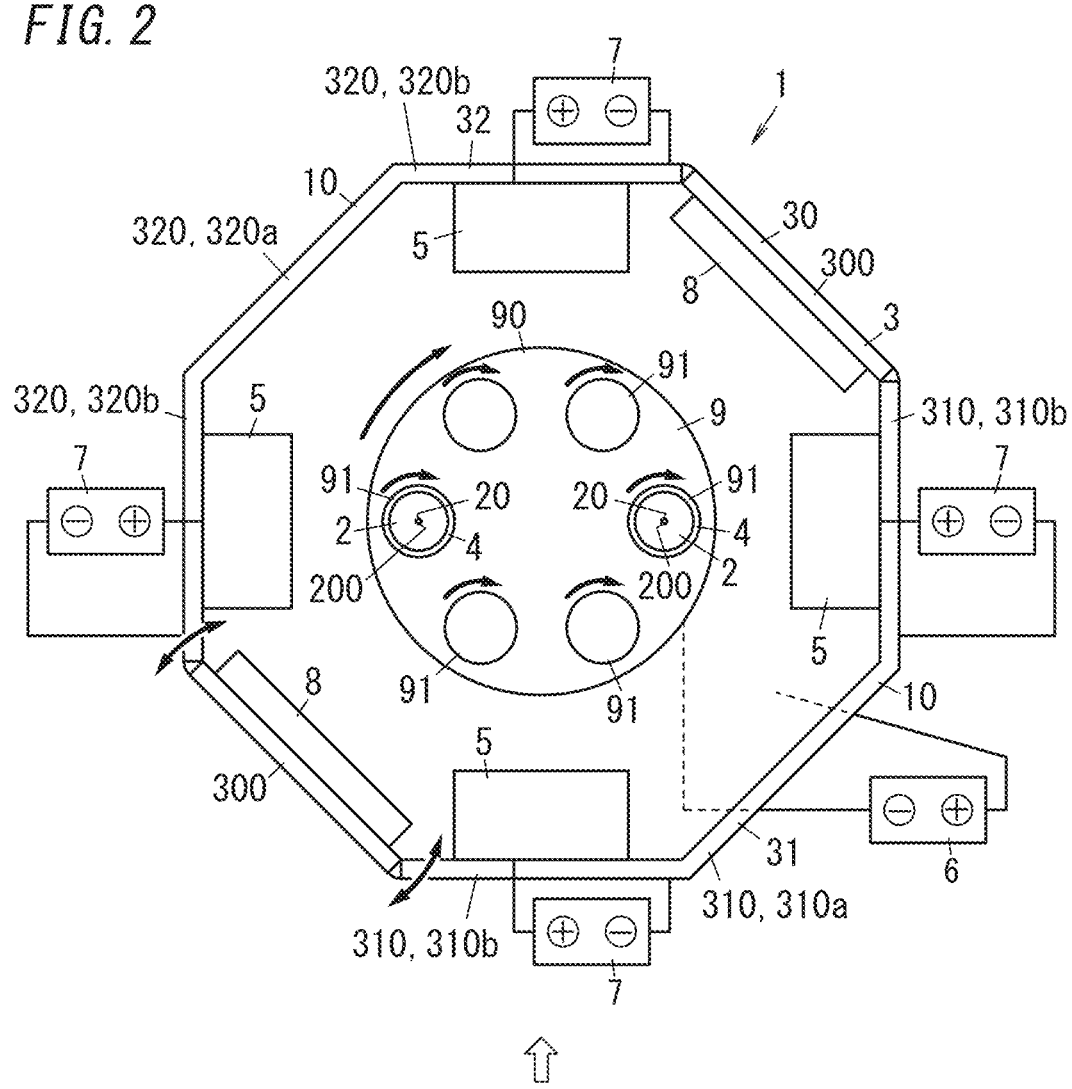
FIG. 2 is a plan view schematically showing the film-forming device.

A film-forming device 1 of an embodiment shown in FIGS. 1 and 2 is a film-forming device configured to form a film on a substrate 2 having a hole 20. The film-forming device 1 includes: a chamber 3 in which the substrate 2 is to be housed; a support 4 provided in the chamber 3 and configured to support the substrate 2 with a hole 20 formed in the substrate 2 being open in a vertical direction; and an evaporation source 5 provided in the chamber 3 and having an evaporation surface 520 from which metal ions 50 are to be generated. The evaporation source 5 is installed such that the evaporation surface 520 is directed in a prescribed direction D1 which is tilted with respect to a horizontal direction, and in the prescribed direction in which the evaporation surface 520 is directed, part of an inner peripheral surface 200 of the hole 20 of the substrate 2 is located.

Moreover, a film-forming unit 10 of an embodiment includes: a door 31 (32) detachably attached to a chamber body 30 in which the substrate 2 having the hole 20 is to be housed; and the evaporation source 5 installed on the door 31(32) and having the evaporation surface 520 from which the metal ions 50 are to be generated. The evaporation source 5 is installed with the evaporation surface 520 being directed in the prescribed direction D1 which is tilted with respect to the horizontal direction.

Moreover, a film-forming method of an embodiment shown in FIGS. 4A to 4D is a film-forming method that includes forming a film on the substrate 2 having the hole 20. The film-forming method includes a disposition step, a bombardment step, and a film-forming step. The disposition step includes disposing the substrate 2 in the chamber 3 with the hole 20 being open in the vertical direction. The bombardment step includes bombarding the inner peripheral surface 200 of the hole 20 of the substrate 2 with ions to clean the inner peripheral surface 200. The film-forming step includes forming the film from metal ions 50 on the inner peripheral surface 200, the metal ions 50 being generated from the evaporation source 5 installed in the chamber 3. The evaporation source 5 has the evaporation surface 520 from which the metal ions 50 are to be generated. The evaporation source 5 is installed with the evaporation surface 520 being directed in the prescribed direction D1 which is tilted with respect to the horizontal direction such that part of the inner peripheral surface 200 is located in the prescribed direction D1.

The film-forming device 1, the film-forming unit 10, and the film-forming method having the above-described configurations of the embodiments enable the metal ions 50 to be applied to the inner peripheral surface 200 of the hole 20 with respect to the substrate 2 with the hole 20 being open in the vertical direction. Thus, the film-forming device 1, the film-forming unit 10, and the film-forming method of the embodiments enable impurities such as an oxide film peeled off from the inner peripheral surface 200 due to bombardment with ions such as the metal ions 50 to be suppressed from depositing on part of the inner peripheral surface 200 in a film-forming process. In addition, the film-forming device 1, the film-forming unit 10, and the film-forming method of the embodiments enable the metal ions 50 to be applied, to the inner peripheral surface 200 from which the impurities have been removed, from the evaporation source 5 installed such that the prescribed direction D1 is tilted with respect to the horizontal direction. Thus, in the film-forming device 1, the film-forming unit 10, and the film-forming method of the embodiments, the metal ions 50 are easily thickly applied to the inner peripheral surface 200, and a film formed from the metal ions 50 is easily tightly attached to the inner peripheral surface 200. Thus, the film-forming device 1, the film-forming unit 10, and the film-forming method of the embodiments enable the adhesiveness of the film coating the inner peripheral surface 200 of the hole 20 of the substrate 2 to be improved.

2. Details 2-1. Film-Forming Device

Subsequently, the film-forming device 1 of the embodiment will be described in detail. The film-forming device 1 is a device configured to form a thin film on a surface of a substrate by a physical vapor deposition (PVD) method. In the present embodiment, the film-forming device 1 is a device configured to perform an arc ion plating method of evaporating an evaporation material by vacuum arc discharge to form a film on the surface of the substrate.

The substrate 2 is a mold for use in press work and is more specifically a punching die for shearing work. The substrate 2 has the hole 20 which is open in the vertical direction. In the present embodiment, the hole 20 penetrates the substrate 2 in the vertical direction and is open both upward and downward. The inner peripheral surface 200 of the hole 20 has a lower part having a draft angle such that the opening area of the hole 20 downwardly increases. The hole 20 has a circular shape, an ellipse shape, a polygonal shape, or the like in plan view.

The film-forming device 1 includes a bias power supply 6, a discharge power supply 7, a gas supply device (not shown), a depressurization device (not shown), and a heater 8 in addition to the chamber 3, the support 4, and the evaporation source 5.

As shown in FIG. 2, the chamber 3 is a housing having an octagonal hollow in plan view. The interior of the chamber 3 can be depressurized by the depressurization device to achieve a vacuum state, and the interior in the vacuum state can be kept hermetically.

The chamber 3 includes the chamber body 30 and the pair of doors 31 and 32 detachably attached to the chamber body 30. The pair of doors 31 and 32 face each other. The chamber body 30 is located between the pair of doors 31 and 32. Opening at least one of the pair of doors 31 and 32 exposes the internal space of the chamber 3.

In the present embodiment, the door 31 has three side walls 310 constituting three adjoining sides of eight sides of the octagon, and the door 32 has three side walls 320 constituting three adjoining sides of the eight sides of the octagon. The chamber body 30 has two side walls 300 constituting two sides facing each other of the eight sides of the octagon.

To the chamber 3, a gas supply device is connected. The gas supply device is configured to supply an inert gas such as argon to the interior of the chamber 3. To the chamber 3, a depressurization device is also connected. The depressurizing device is configured to depressurize the interior of the chamber 3 to achieve a vacuum state by discharging air from the interior of the chamber 3. The gas supply device and the depressurization device are connected to, for example, the side walls 300 of the chamber body 30. Note that the gas supply device may be configured to supply other gas required for formation of a film than the inert gas.

Moreover, in the chamber 3, heaters 8 are provided. The heaters 8 are configured to heat the interior of the chamber 3 to evaporate an adhering substance such as moisture on a surface of the substrate 2. The respective heaters 8 are attached to, for example, the two side walls 300 of the chamber body 30.

The chamber body 30 has a bottom part provided with a worktable 9. The worktable 9 is a table having a circular shape in plan view. The worktable 9 includes: a table body 90 rotatable around a perpendicular axis extending through the substantial center of the bottom part of the chamber 3;

and a plurality of support tables 91 rotatably and vertically movably provided to the table body 90.

Each support table 91 is a table having a circular shape in plan view and is rotatable around a perpendicular axis extending through its own substantial center in plan view. The plurality of support tables 91 are arranged around the axis of the table body 90 at equal intervals in the circumferential direction of the table body 90. In the present embodiment, the worktable 9 includes six support tables 91. While the table body 90 of the worktable 9 rotates around the axis of the table body 90, the plurality of support tables 91 rotate around their respective axes. Note that the rotation of the table body 90 and the rotation of each support table 91 do not have to be linked with each other and may be individually controlled.

A holder (not shown) for holding a plurality of substrates 2 separately in the vertical direction is installable on each support table 91. Installing the holder on each support table 91 enables the plurality of substrates 2 to be installed on each support table 91 such that the substrates 2 are separated from each other in the vertical direction. This enables each of the plurality of substrates 2 to rotate around the axis of the table body 90 and to rotate around the axis of a corresponding one of the support tables 91.

In the present embodiment, each support table 91 is vertically movable with respect to the table body 90 as shown in FIG. 1. For each support table 91, for example, a user controls a control device to adjust the vertical location of each support table 91 such that the substrate 2 placed on each support table 91 faces (i.e., faces straight in front of) the evaporation surface 520 of the evaporation source 5. Note that the height of each support table 91 may be automatically adjusted by the control device.

In the present embodiment, the support 4 is the support table 91. Note that the support 4 may be the holder installed on the support table 91 or may be the table body 90.

The bias power supply 6 configured to apply a negative voltage to the worktable 9 is connected to the worktable 9. The bias power supply 6 applies the negative voltage to the worktable 9, and thereby, the negative voltage is applied to the substrate 2 supported by the support table 91 of the worktable 9.

The evaporation source 5 is provided in the chamber 3. The evaporation source 5 has the evaporation surface 520 from which the metal ions 50 are to be generated. The evaporation source 5 is installed such that the evaporation surface 520 is directed in a prescribed direction D1 which is tilted with respect to a horizontal direction, and in the prescribed direction D1 in which the evaporation surface 520 is directed, part of an inner peripheral surface 200 of the hole 20 of the substrate 2 is located.

More specifically, the evaporation source 5 includes a housing 51 and an evaporation material 52 detachably attached to the housing 51. The housing 51 has an attachment surface 510 to which the evaporation material 52 is attached. The attachment surface 510 is a surface facing (i.e., facing straight in front of) the substrate 2 supported by the support 4. The housing 51 is attached to the side wall of the chamber 3 such that the attachment surface 510 faces the substrate 2 supported by the support 4. In the present embodiment, the attachment surface 510 is directed diagonally downward.

The evaporation material 52 is a plate-like member such as a round plate. The evaporation material 52 has the evaporation surface 520, from which the metal ions 50 are to be generated, on one side in the thickness direction thereof. The prescribed direction D1 in which the evaporation surface 520 is directed means a direction, in the thickness direction of the evaporation material 52, in which the evaporation surface 520 is directed. The prescribed direction D1 in which the evaporation surface 520 is directed is the same as a direction in which the attachment surface 510 of the housing 51 is directed.

To the evaporation source 5, the discharge power supply 7 is connected. The discharge power supply 7 is configured to cause arc discharge at the evaporation surface 520 of the evaporation material 52. The discharge power supply 7 has a positive electrode connected to the evaporation source 5. The discharge power supply 7 applies a positive voltage to the evaporation source 5 to cause the arc discharge at the evaporation surface 520, which dissolves and evaporates the evaporation material 52, thereby generating steam of the metal ions 50 from the evaporation surface 520.

In the present embodiment, the film-forming device 1 includes a plurality of (specifically, eight) evaporation sources 5 as illustrated in FIGS. 1 and 2. The evaporation sources 5 are attached to the door 31 of the chamber 3. The evaporation source 5 are attached to the door 32 of the chamber 3. The evaporation sources 5 are not attached to the chamber body 30. Two evaporation sources 5 are attached, with a space therebetween in the vertical direction, to each of two side walls 310b of the three side walls 310 of the door 31 except for a side wall 310a between the two side walls 310b, and two evaporation sources 5 are attached, with a space therebetween in the vertical direction to each of two side walls 320b of the three side walls 320 of the door 32 except for a side wall 320a between the two side walls 320b.

In the present embodiment, each evaporation source 5 is installed such that the prescribed direction D1 in which the evaporation surface 520 is directed forms an angle of 15 to 30 degrees with respect to the horizontal direction, and the evaporation surface 520 is directed diagonally downward. The substrate 2 supported by the support 4 is installed at a location at which the substrate 2 faces the evaporation surface 520. Note that the installation angle of each evaporation source 5 may be accordingly set.

2-2. Film-Forming Unit

Subsequently, the film-forming unit 10 of the embodiment will be described in further detail. The film-forming unit 10 constitutes part of the film-forming device 1 described above.

The film-forming unit 10 includes: the door 31 (32) detachably attached to the chamber body 30; and the evaporation source 5 installed on the door 31 (32) and having the evaporation surface 520 from which the metal ions 50 are to be generated. The evaporation source 5 is installed with the evaporation surface 520 being directed in the prescribed direction D1 which is tilted with respect to the horizontal direction.

The film-forming device 1 of the present embodiment includes two film-forming units 10. One of the two film-forming units 10 has the door 31, and the other of the two film-forming units 10 has the door 32.

At an end of one of the two side walls 310b of the door 31, the one of the film-forming units 10 is pivotably connected to the side wall 300 of the chamber body 30 via a hinge. Moreover, at one of the two side walls 320b of the door 32, the other of the film-forming units 10 is pivotably connected to the side wall 300 of the chamber body 30 via a hinge. Each of the two film-forming units 10 is removably attached to the chamber body 30.

The film-forming units 10 are usable also as replacement components of a pair of doors of an already-installed chamber 3. Moreover, the film-forming unit 10 is vendible by itself.

2-3. Film-Forming Method

Subsequently, the film-forming method of forming a film on the inner peripheral surface 200 of the hole 20 of the substrate 2 by using the film-forming device 1 will be described in detail.

The film-forming method includes the disposition step, a depressurization step, a heating step, the bombardment step, and the film-forming step.

The disposition step includes disposing the substrate 2 in the chamber 3 with the hole 20 being open in the vertical direction. In the disposition step of the present embodiment, at least one of the pair of doors 31 or 32 of the chamber 3 is opened at first, and then, the substrate 2 is placed on at least one support table 91 of the plurality of support tables 91 of the worktable 9 with the hole 20 being upwardly open. After the substrate 2 is placed on the support table 91, the pair of doors 31 and 32 are closed such that the internal space of the chamber 3 is hermetically closed.

The depressurization step includes discharging air from the interior of the chamber 3 by the depressurization device to make the interior of the chamber 3 vacuum. Then, the gas supply device supplies, to the interior of the chamber 3, an inert gas such as argon gas and/or a gas required for forming the film.

The heating step includes heating the interior of the chamber 3 by the heaters 8 to evaporate impurities such as moisture attached on a surface of the substrate 2.

The bombardment step includes bombarding the inner peripheral surface 200 of the hole 20 of the substrate 2 with ions to clean the inner peripheral surface 200. The film-forming step includes forming the film from the metal ions 50 on the inner peripheral surface 200, the metal ions 50 being generated from the evaporation source 5 installed in the chamber 3. In this embodiment, the evaporation source 5 has the evaporation surface 520 from which the metal ions 50 are to be generated, and the evaporation source 5 is installed such that the evaporation surface 520 is directed in the prescribed direction D1 which is tilted with respect to the horizontal direction, and in the prescribed direction D1 in which the evaporation surface 520 is directed, part of the inner peripheral surface 200 is located.

The bombardment step of the present embodiment is a step of bombarding the inner peripheral surface 200 of the hole 20 of the substrate 2 with the metal ions 50 generated from the evaporation source 5 to clean the inner peripheral surface 200.

Figure 3:
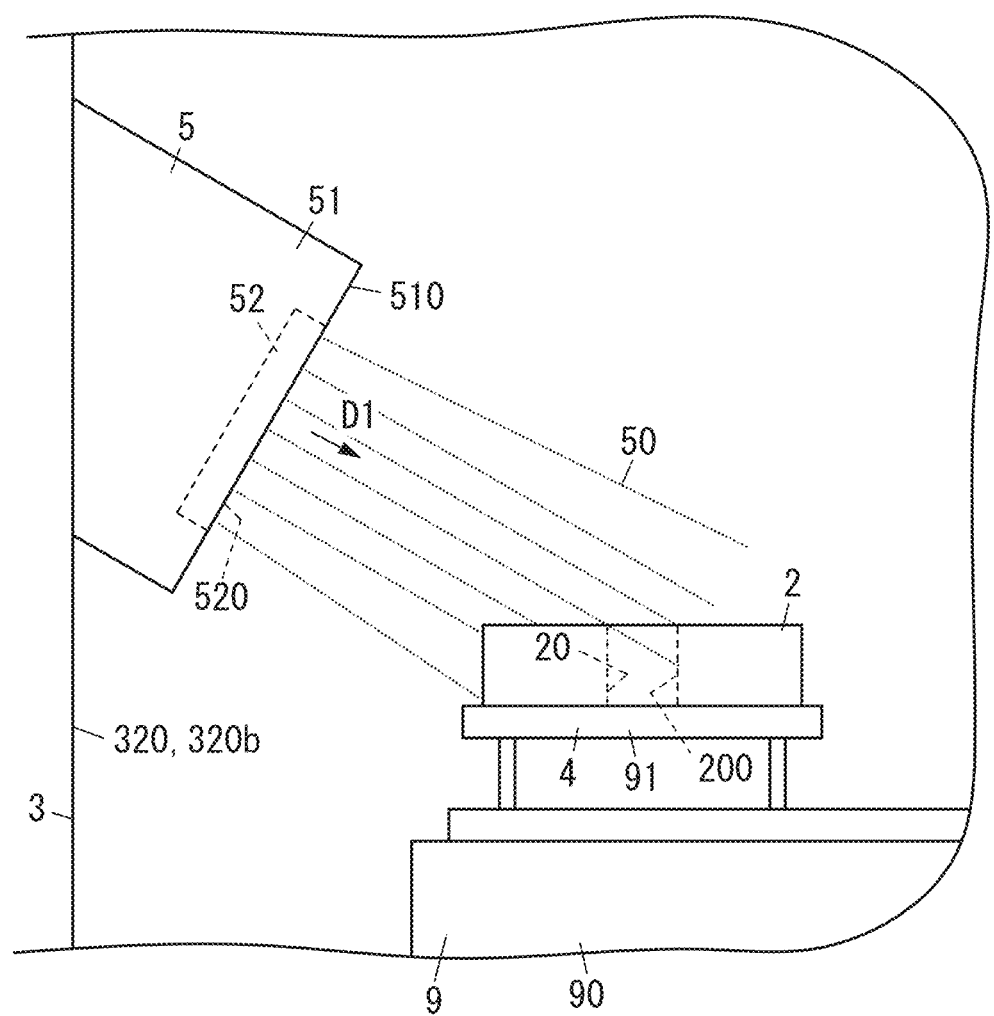
FIG. 3 is an enlarged front view of a main part of FIG. 1.

More specifically, in the bombardment step and the film-forming step of the present embodiment, as illustrated in FIG. 3, the vertical location of the support table 91 is adjusted such that part of the inner peripheral surface 200 of the hole 20 of the substrate 2 is located to face (i.e., face straight in front of) the evaporation surface 520 of the evaporation source 5. Then, a positive voltage from the discharge power supply 7 is applied to the evaporation source 5 to cause arc discharge at the evaporation surface 520 of the evaporation material 52, thereby generating vapor of the metal ions 50 from the evaporation surface 520. Subsequently, a negative voltage is applied from the bias power supply 6 to the worktable 9 such that the negative voltage is applied to the substrate 2. This moves the metal ions 50 evaporated from the evaporation surface 520 of the evaporation material 52 of the evaporation source 5 toward the substrate 2 at high speed, and thus, part of the inner peripheral surface 200 (specifically, part of the inner peripheral surface 200 which faces (i.e., faces straight in front of) the evaporation surface 520) of the hole 20 of the substrate 2 is bombarded with the metal ions 50.

In the bombardment step and the film-forming step, the table body 90 of the worktable 9 and the support table 91 on which the substrate 2 has been placed are rotated, thereby rotating the substrate 2. This changes part, which is bombarded with the metal ions 50 output from the evaporation source 5, of the inner peripheral surface 200 of the hole 20 of the substrate 2 such that upper part of the inner peripheral surface 200 of the hole 20 (e.g., in the range from 5 mm to 10 mm from the upper end of the hole 20) is bombarded with the metal ions 50 over the entire length in the circumferential direction of the substrate 2.

An initial stage of a step of bombarding the inner peripheral surface 200 of the hole 20 of the substrate 2 with the metal ions 50 generated from the evaporation source 5 is the bombardment step, and a stage following the initial stage is the film-forming step. In the bombardment step of the present embodiment, the inner peripheral surface 200 is bombarded with the metal ions 50 generated from the evaporation source 5, and thereby, the impurities such as an oxide film attached to the inner peripheral surface 200 are peeled off. That is, in the bombardment step of the present embodiment, metal ion bombardment of bombarding the surface of the substrate 2 with the metal ions 50 to clean the surface is performed. Here, the lower part of the inner peripheral surface 200 of the hole 20 of the substrate 2 has a draft angle such that the opening area of the hole 20 downwardly increases, and therefore, the impurities peeled off from the part of the inner peripheral surface 200 do not accumulate on the other part of the inner peripheral surface 200 but fall onto the support table 91.

In the bombardment step of the present embodiment, the upper part of the inner peripheral surface 200 of the hole 20 of the substrate 2 rotating is bombarded with the metal ions 50, and thereby, impurities F1 such as an oxide film at the upper part of the inner peripheral surface 200 peel off over the entire length in the circumferential direction of the inner peripheral surface 200 as shown in FIGS. 4A and 4B.

In the film-forming step of the present embodiment, the upper part, from which the impurities F1 have been removed, of the inner peripheral surface 200 of the hole 20 of the substrate 2 rotating is bombarded with the metal ions 50, and thereby, the upper part of the inner peripheral surface 200 is coated with the metal ions 50 over the entire length in the circumferential direction (in other words, provided with a film F2 formed from the metal ions 50) as shown in FIGS. 4C and 4D. Note that in FIGS. 4A to 4D, the impurities F1 and the film F2 are schematically shown.

Of the inner peripheral surface 200, a remaining part except for the upper part does not face (i.e., face straight in front of) the evaporation surface 520, and therefore, the remaining part is hardly bombarded with the metal ions 50, the impurities F1 are hardly removed, and the remaining part is hardly coated with the metal ions 50.

Moreover, according to the film-forming method of the present embodiment, not only the inner peripheral surface 200 of the hole 20 of the substrate 2 but also an upper surface and an outer peripheral surface of the substrate 2 are bombarded with the metal ions 50 generated from the evaporation surface 520, and therefore, the upper surface and the outer peripheral surface of the substrate 2 can be subjected to the bombardment step and the film-forming step.

3. Operation and Advantages

The film-forming device 1, the film-forming unit 10, and the film-forming method of the embodiment escribed above, the metal ions 50 can be applied to the inner peripheral surface 200 of the hole 20 with respect to the substrate 2 with the hole 20 being open in the vertical direction. Thus, in one step (specifically, the bombardment step) for forming the film, the impurities peeled off from the inner peripheral surface 200 due to bombardment with ions (the metal ions 50) can be suppressed from depositing on part of the inner peripheral surface 200. In addition, the film-forming device 1 of the embodiment enables the metal ions 50 to be applied, to the inner peripheral surface 200 from which the impurities have been removed, from the evaporation source 5 installed such that the prescribed direction D1 is tilted with respect to the horizontal direction. Thus, in the film-forming device 1 of the embodiment, the metal ions 50 are easily thickly applied to the inner peripheral surface 200, and a film formed from the metal ions 50 is easily tightly attached to the inner peripheral surface 200. Thus, the film-forming device 1 of the embodiment enables the adhesiveness of the film on the inner peripheral surface 200 of the hole 20 of the substrate 2 to be improved.

Moreover, in the film-forming device 1, the film-forming unit 10, and the film-forming method of the present embodiment, the vertical location of the support 4 (the support table 91) configured to support the substrate 2 is adjustable, and therefore, the inner peripheral surface 200 of the hole 20 of the substrate 2 is easily disposed to face (i.e., face straight in front of) the evaporation surface 520 of the evaporation source 5. Thus, in the film-forming device 1, the film-forming unit 10, and the film-forming method of the present embodiment, the inner peripheral surface 200 of the hole 20 of the substrate 2 is easily bombarded with the metal ions 50 generated from the evaporation surface 520 of the evaporation source 5, which enables the bombardment step and the film-forming step to be efficiently performed. This can reduce the amount of the evaporation material 52 required in the bombardment step and the film-forming step.

Moreover, in the film-forming device 1, the film-forming unit 10, and the film-forming method of the present embodiment, the support table 91 is rotatable, and therefore, the substrate 2 is rotatable, and the inner peripheral surface 200 of the hole 20 of the substrate 2 is bombarded with the metal ions 50 generated from the evaporation source 5 over the entire length in the circumferential direction. Thus, in the film-forming device 1, the film-forming unit 10, and the film-forming method of the present embodiment, the thickness of a film formed from the metal ions 50 on the inner peripheral surface 200 of the hole 20 of the substrate 2 is easily made uniform over the entire length in the circumferential direction of the inner peripheral surface 200, which easily provides stable adhesiveness of the film.

Moreover, in the film-forming device 1, the film-forming unit 10, and the film-forming method of the present embodiment, the film formed of the metal ions 50 is on only the upper part of the inner peripheral surface 200 of the hole 20 of the substrate 2. In the present embodiment, the substrate 2 is a punching die for press work, and therefore, the adhesiveness of the film coating the upper part of the inner peripheral surface 200 of the hole 20 is important, and a film does not have to be formed on the lower part of the inner peripheral surface 200 of the hole 20.

4. Variation

Subsequently, variations of the film-forming device 1 and the film-forming method described above will be described. Note that any of the variations to be described below may be combined as appropriate.

The film-forming device 1 is at least a configured to form a thin film on a surface of the substrate 2 by a physical vapor deposition (PVD) method and may be a device configured to form a film by a method other than the arc ion plating method.

The film-forming device 1 may include a bombardment device configured to perform the bombardment step separately from the evaporation source 5. The bombardment device includes a cathode (cathode electrode) and an anode (anode electrode) which ionize an inert gas by, for example, causing glow discharge in the internal space of the chamber 3. In this case, in a state where ions of the inert gas are generated by the bombardment device, a negative voltage is applied from the bias power supply 6 to the worktable 9 such that the negative voltage is applied to the substrate 2, and thereby, the inner peripheral surface 200 of the substrate 2 is bombarded with the ions of the inert gas to clean the inner peripheral surface 200. After cleaning of the inner peripheral surface 200 with the ions of the inert gas ends, the evaporation source 5 forms a film from the metal ions 50 on the inner peripheral surface 200.

The film-forming device 1 is at least installed such that the prescribed direction D1, in which the evaporation surface 520 of the evaporation source 5 is directed, is tilted with respect to the horizontal direction, and in the prescribed direction D1 in which the evaporation surface 520 is directed, part of the inner peripheral surface 200 of the hole 20 of the substrate 2 is located, and the structure of the film-forming device 1 is thus not limited to the structure shown in FIGS. 1 and 2. For example, the film-forming device 1 does not have to include the bias power supply 6 or the discharge power supply 7. The film-forming device 1 may be a device configured to generate metal ions 50 from the evaporation surface 520 by a method other than the arc discharge. Moreover, the film-forming device 1 may be a device configured to move the metal ions 50 from the evaporation surface 520 toward the substrate 2 by a method other than the method of applying a negative voltage from the bias power supply 6 to the substrate 2.

The support 4 does not have to be rotatable around the axis parallel to the gravity direction. In this case, for example, the evaporation source 5 is at least disposed to move along a round trajectory around the support 4 (the substrate 2).

Moreover, the position of the support 4 in the vertical direction does not have to be changeable. In this case, for example, the evaporation source 5 is at least provided movably in the vertical direction.

Figure 5:
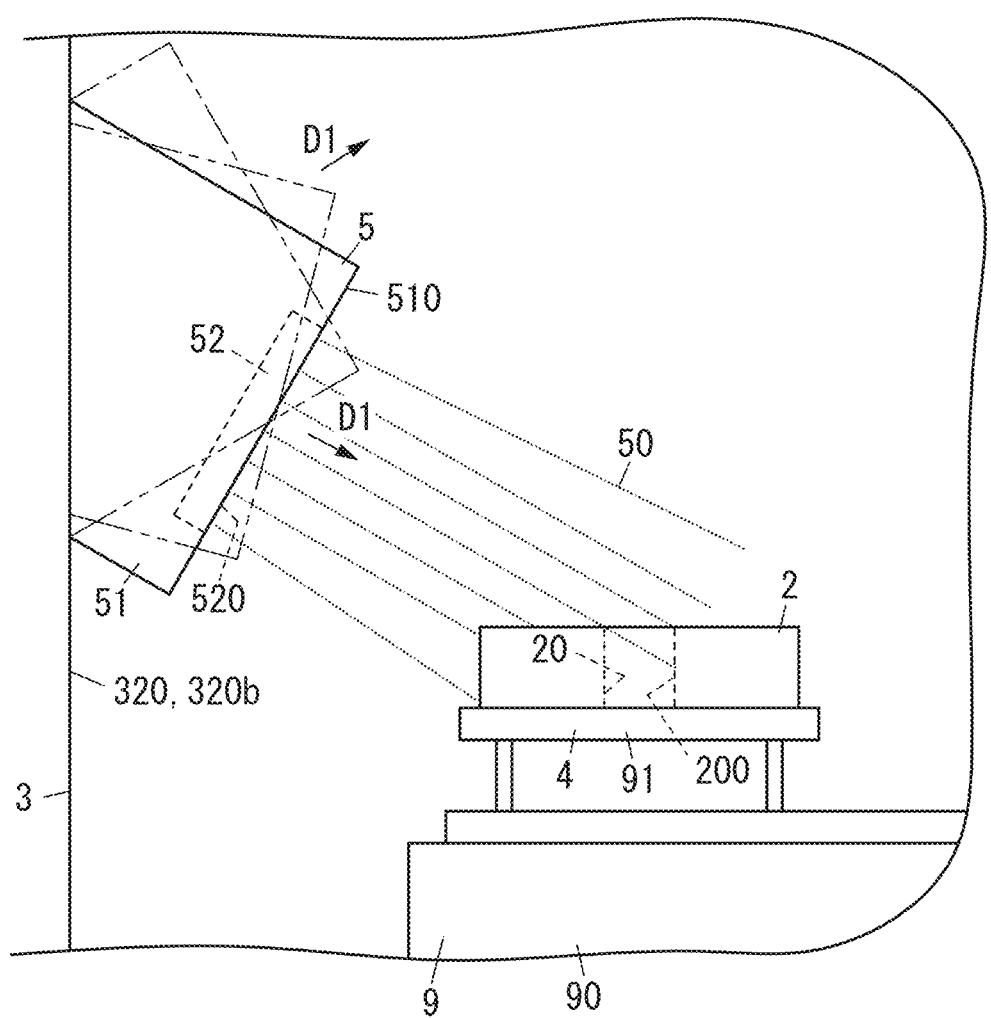
FIG. 5 is a front view schematically showing a variation of the film-forming device.

Moreover, the evaporation source 5 may be configured such that the prescribed direction D1 in which the evaporation surface 520 faces is changeable as the variation shown in FIG. 5. The prescribed direction D1 is changeable, for example, within the range from −30 degrees to +30 degrees with respect to the horizontal direction. In this case, for example, the evaporation source 5 is attached to the side wall of the chamber 3 via a support mechanism configured to adjust the angle. Adjusting the angle of the evaporation source 5 by the support mechanism is automatically performed by, for example, an operation given to the control device by a user. Note that the support mechanism may be manually operated by a user.

Moreover, the film-forming device 1 is not limited the a device including the evaporation source 5 attached to the door 31(32) but may be a device including the evaporation source 5 attached to the chamber body 30.

Moreover, the film-forming device 1 may include a conventional evaporation source 5 with its evaporation surface 520 being directed in the horizontal direction in addition to the evaporation source 5 installed with the evaporation surface 520 being directed to the prescribed direction D1 which is tilted with respect to the horizontal direction.

Moreover, in the film-forming device 1, of the two evaporation sources 5 vertically aligned with each other, an upper evaporation source 5 may be installed with its evaporation surface 520 facing obliquely downward, and a lower evaporation source 5 may be installed with its evaporation surface 520 facing obliquely upward. In this case, the inner peripheral surface 200 of the hole 20 of the substrate 2 held by the holder member installed on the support table 91 is bombarded with the metal ions 50 both obliquely upward and obliquely downward, and thus, a film coating all over the inner peripheral surface 200 in the vertical direction can be formed. Moreover, the film-forming device 1 may be installed such that the evaporation surfaces 520 of all of the plurality of evaporation sources 5 are directed obliquely upward.

5. Summary

As in the embodiment and its variations described above, a film-forming device (1) of a first aspect has the following configurations.

That is, the film-forming device (1) of the first aspect is a film-forming device configured to form a film on a substrate (2) having a hole (20). The film-forming device (1) includes: a chamber (3) in which the substrate (2) is to be housed; a support (4) disposed in the chamber (3); the support (4) being configured to support the substrate (2) with the hole (20) being open in a vertical direction; and an evaporation source (5) disposed in the chamber (3), the evaporation source (5) having an evaporation surface (520) from which metal ions (50) are to be generated. The evaporation source (5) is installed such that the evaporation surface (520) is directed in a prescribed direction (D1) which is tilted with respect to a horizontal direction, and in the prescribed direction (D1) in which the evaporation surface (520) is directed, part of an inner peripheral surface (200) of the hole (20) of the substrate (2) is located.

The film-forming device (1) of the first aspect having the above-described configuration enables the metal ions (50) to be applied to the inner peripheral surface (200) of the hole (20) with respect to the substrate (2) with the hole (20) being open in the vertical direction. Thus, the film-forming device (1) of the first aspect enables impurities such as an oxide film peeled off from the inner peripheral surface (200) due to bombardment with ions such as the metal ions (50) to be suppressed from depositing on part of the inner peripheral surface (200) in a film-forming process. In addition, the film-forming device (1) of the first aspect enables the metal ions (50) to be applied to the inner peripheral surface (200) from the evaporation source (5), the evaporation source (5) being installed with the prescribed direction (D1) being tilted with respect to the horizontal direction, the impurities having been removed from the inner peripheral surface (200). Thus, in the film-forming device (1) of the first aspect, the metal ions (50) are easily thickly applied to the inner peripheral surface (200), and a film formed from the metal ions (50) is easily tightly attached to the inner peripheral surface (200). Thus, the film-forming device (1) of the first aspect enables the adhesiveness of a film coating the inner peripheral surface (200) of the hole (20) formed in the substrate (2) to be improved.

Moreover, as in the above-described embodiment and its variation, a film-forming device (1) of a second aspect further includes the following configuration in addition to the configuration of the first aspect.

That is, the film-forming device (1) of the second aspect further includes: a bias power supply (6) configured to apply a negative voltage to the substrate (2) by applying the negative voltage to the support (4); and a discharge power supply (7) configured to cause arc discharge at the evaporation surface (520) to generate metal ions (50) by applying a positive voltage to the evaporation source (5).

In the film-forming device (1) of the second aspect having the above-described configuration, the metal ions (50) generated from the evaporation surface (520) are easily moved toward the substrate (2) at high speed, the inner peripheral surface (200) of the hole (20) of the substrate (2) is easily bombarded with the metal ions (50), and thus, a film is easily formed from the metal ions (50) on the inner peripheral surface (200).

Moreover, as in the above-described embodiment and its variation, a film-forming device (1) of a third aspect further includes the following configuration in addition to the configuration of the second aspect.

That is, in the film-forming device (1) of the third aspect, the evaporation source (5) is configured to perform a bombardment step and a film-forming step. The bombardment step includes bombarding part of the inner peripheral surface (200) of the hole (20) of the substrate (2) with the metal ions (50) to clean the part of the inner peripheral surface (200). The film-forming step includes bombarding the part of the inner peripheral surface (200) thus cleaned with the metal ions (50) to form a film from the metal ions (50) on the inner peripheral surface (200).

In the film-forming device (1) of the third aspect having the above-described configuration, the inner peripheral surface (200) of the hole (20) of the substrate (2) is easily thickly bombarded with the metal ions (50), and thus, the impurities such as an oxide film attached to the inner peripheral surface (200) are easily removed. Moreover, the film-forming device (1) of the third aspect does not have to include a device configured to perform the bombardment step separately from the evaporation source (5), and therefore, the structure can be simplified.

Moreover, as in the above-described embodiment and its variation, a film-forming device (1) of a fourth aspect further includes the following configuration in addition to the configuration of any one of the first to third aspects.

That is, in the film-forming device (1) of the fourth aspect, the support (4) is rotatable around an axis parallel to a gravity direction.

The film-forming device (1) of the fourth aspect having the above-described configuration enables the substrate (2) supported by the support (4) to be rotated around the axis parallel to the gravity direction, and thus, the metal ions (50) are easily applied to the inner peripheral surface (200) over the entire length in a circumferential direction of the hole (20) of the substrate (2). Thus, in the film-forming device (1) of the fourth aspect, the thickness of a film formed from the metal ions (50) on the inner peripheral surface (200) of the hole (20) of the substrate (2) is easily made uniform over the entire length in the circumferential direction of the inner peripheral surface (200).

Moreover, as in the above-described embodiment and its variation, a film-forming device (1) of a fifth aspect further includes the following configuration in addition to the configuration of any one of the first to fourth aspects.

That is, in the film-forming device (1) of the fifth aspect, the support (4) is positionally changeable in a vertical direction.

In the film-forming device (1) of the fifth aspect having the above-described configuration, the position of the substrate (2) supported by the support (4) is changeable in the vertical direction, and therefore, the inner peripheral surface (200) of the hole (20) of the substrate (2) is easily disposed to face (i.e., face straight in front of) the evaporation surface (520) of the evaporation source (5), and thus, the metal ions (50) are easily applied to the inner peripheral surface (200).

Moreover, as in the above-described embodiment and its variation, a film-forming device (1) of a sixth aspect further includes the following configuration in addition to the configuration of the first to fifth aspects.

That is, in the film-forming device (1) of the sixth aspect, the evaporation source (5) is adjustable in terms of the prescribed direction (D1) in which the evaporation surface (520) is directed.

The film-forming device (1) of the sixth aspect having the above-described configuration, the prescribed direction (D1) in which the evaporation surface (520) is directed can be changed to an appropriate direction in accordance with the location of the inner peripheral surface (200) of the hole (20) of the substrate (2), and therefore, the metal ions (50) are easily applied to the inner peripheral surface (200).

Moreover, as in the above-described embodiment and its variation, a film-forming device (1) of a seventh aspect further includes the following configuration in addition to the configuration of any one of the first to sixth aspects.

That is, in the film-forming device (1) of the seventh aspect, the chamber (3) includes a chamber body (30) and a door (31, 32) detachably attached to the chamber body (30). The evaporation source (5) is attached to the door (31, 32).

The film-forming device (1) of the seventh aspect having the above-described configuration, the door (31, 32) to which the evaporation source (5) is attached is detachable from the chamber body (30), which facilitates the maintenance of the evaporation source (5) and work of changing an attachment angle of the evaporation source (5).

Moreover, as in the above-described embodiment and its variation, a film-forming unit (10) of an eighth aspect includes the following configuration.

That is, the film-forming unit (10) of the eighth aspect includes: a door (31, 32) detachably attached to a chamber body (30) in which a substrate (2) having a hole (20) is to be housed; and an evaporation source (5) installed on the door (31, 32), the evaporation source (5) having an evaporation surface (520) from which metal ions (50) are to be generated. The evaporation source (5) is installed with the evaporation surface (520) being directed in a prescribed direction (D1) which is tilted with respect to a horizontal direction.

The film-forming unit (10) of the eighth aspect having the above-described configuration is detachably attached to the chamber body (30) and is thus usable, for example, as a replacement component of a door of an already-installed film-forming device and provides great versatility.

Moreover, as in the above-described embodiment and its variation, a film-forming method of a ninth aspect has the following configuration.

That is, the film-forming method of the ninth aspect is a film-forming method including forming a film on a substrate (2) having a hole (20). The film-forming method of the ninth aspect includes a disposition step, a bombardment step, and a film-forming step. The disposition step includes disposing the substrate (2) in a chamber (3) with the hole (20) being open in a vertical direction. The bombardment step includes bombarding an inner peripheral surface (200) of the hole (20) of the substrate (2) with ions to clean the inner peripheral surface (200). The film-forming step includes forming the film from metal ions (50) on the inner peripheral surface (200), the metal ions (50) being generated from an evaporation source (5) installed in the chamber (3). The evaporation source (5) has an evaporation surface (520) from which the metal ions (50) are to be generated. The evaporation source (5) is installed such that the evaporation surface (520) is directed in a prescribed direction (D1) which is tilted with respect to a horizontal direction, and in the prescribed direction (D1) in which the evaporation surface (520) is directed, part of an inner peripheral surface (200) is located.

The film-forming method of the ninth aspect having the above-described configuration enables the inner peripheral surface (200) of the hole (20) to be bombarded with the ions with respect to the substrate (2) with the hole (20) being open in the vertical direction. Thus, the film-forming method of the ninth aspect enables the impurities peeled off from the inner peripheral surface (200) due to bombardment with the ions to be suppressed from depositing on part of the inner peripheral surface (200) in the bombardment step. In addition, the film-forming method of the ninth aspect enables the metal ions (50) to be applied to the inner peripheral surface (200) from the evaporation source (5), the evaporation source (5) being installed with the prescribed direction (D1) being tilted with respect to the horizontal direction, the impurities having been removed from the inner peripheral surface (200). Thus, in the film-forming method of the ninth aspect, the metal ions (50) are easily thickly applied to the inner peripheral surface (200), and a film formed from the metal ions (50) is easily tightly attached to the inner peripheral surface (200). Thus, the film-forming method of the ninth embodiment enables the adhesiveness of a film coating the inner peripheral surface (200) of the hole (20) formed in the substrate (2) to be improved.

Moreover, as in the above-described embodiment and its variation, a film-forming method of the tenth aspect further includes the following configuration in addition to the configuration of the ninth aspect.

That is, in the film-forming method of the tenth aspect, the bombardment step of the present embodiment is a step of bombarding the inner peripheral surface (200) of the hole (20) of the substrate (2) with the metal ions (50) generated from the evaporation source (5) to clean the inner peripheral surface (200).

In the film-forming method of the tenth aspect including the above-described configuration, the inner peripheral surface (200) of the hole (20) of the substrate (2) is easily thickly bombarded with the metal ions (50), and thus, the impurities such as an oxide film attached to the inner peripheral surface (200) are easily removed. Moreover, the film-forming method of the tenth aspect does not have to include a device configured to perform the bombardment step separately from the evaporation source (5), and therefore, the structure of the film-forming device (1) which performs the film-forming method can be simplified.

The present disclosure has been described based on the embodiments illustrated in the drawings. However, the present disclosure is not limited to the embodiments but may be accordingly modified in design without departing from the intended scope of the present disclosure.

REFERENCE SIGNS LIST

1 Film-forming Device
2 Substrate
20 Hole
200 Inner Peripheral Surface
3 Chamber
30 Chamber Body
31 Door
32 Door
4 Support
5 Evaporation Source
50 Metal Ion
52 Evaporation Material
520 Evaporation Surface
6 Bias Power Supply
7 Discharge Power Supply
10 Film-forming Unit
D1 Prescribed Direction

The invention claimed is:

1. A film-forming method for forming a film on a mold having a hole for shearing work, the film-forming method comprising:

disposing the mold in a chamber with the hole being open in a vertical direction;

bombarding an inner peripheral surface of the hole of the mold with ions to clean the inner peripheral surface; and forming the film from metal ions on the inner peripheral surface, the metal ions being generated from an evaporation source installed in the chamber, the evaporation source having an evaporation surface from which the metal ions are to be generated, the evaporation source being installed such that the evaporation surface is directed in a prescribed direction which is tilted with respect to a horizontal direction, and in the prescribed direction in which the evaporation surface is directed, part of the inner peripheral surface of the hole of the mold is located, the evaporation surface being directed diagonally downward, a direction in which the evaporation surface is directed forming an angle of 15 to 30 degrees with respect to the horizontal direction.

2. The film-forming method of claim 1, wherein the bombardment step is a step of bombarding the inner peripheral surface of the hole of the mold with the metal ions generated from the evaporation source to clean the inner peripheral surface.

* * * * *